United States Patent [19]

Ovshinsky

[11] Patent Number: 4,664,960
[45] Date of Patent: May 12, 1987

[54] COMPOSITIONALLY VARIED MATERIALS AND METHOD FOR SYNTHESIZING THE MATERIALS

[75] Inventor: Stanford R. Ovshinsky, Bloomfield Hills, Mich.

[73] Assignee: Energy Conversion Devices, Inc., Troy, Mich.

[21] Appl. No.: 705,241

[22] Filed: Apr. 22, 1985

Related U.S. Application Data

[62] Division of Ser. No. 422,155, Sep. 23, 1982, Pat. No. 4,520,039.

[51] Int. Cl.$^4$ .............................................. B32B 3/02
[52] U.S. Cl. ........................................ 428/98; 427/35; 427/38; 428/189; 428/212
[58] Field of Search ....................... 427/35, 38; 428/98, 428/189, 212

[56] References Cited

U.S. PATENT DOCUMENTS

| | | | |
|---|---|---|---|
| 3,117,022 | 1/1964 | Bronson et al. | 427/43.1 |
| 3,218,203 | 11/1965 | Ruehrwein | 427/255.7 |
| 3,243,313 | 3/1966 | Aves | 428/189 |
| 3,245,895 | 4/1966 | Baker et al. | 427/38 |
| 3,434,894 | 3/1969 | Gale | 357/91 |
| 3,565,807 | 2/1971 | Siverisen et al. | 428/189 |

(List continued on next page.)

OTHER PUBLICATIONS

Materials Research, 7/1/75 to 6/30/76, Section 7, p. 22.
S. Ruggiero et al., Superconductivity in Quasi-Two-Dimensional Layered Composites, 10-13-80, p. 1299, para. beginning bottom column 1.
Troy W. Barbee, Jr., Sputtered Layered Synthetic Microstructure (LSM) Dispersion Elements, Jul. 8-10, 1981, Section III.

(List continued on next page.)

Primary Examiner—John H. Newsome
Attorney, Agent, or Firm—Marvin S. Siskind; Lawrence G. Norris; Richard M. Goldman

[57] ABSTRACT

Designed tailormade nonequilibrium synthetic disordered materials are provided containing nonperiodically distributed local environments whose position and type are controlled to obtain specific properties which can be coupled or decoupled one from another and collectively from the constraints implied by an ordered structure. Atoms or groups of atoms can be placed in the matrix in specific designed positions to compensate the spins to obtain unusual physical and chemical properties. The compositional variation which produces the required nonequilibrium "multi-disordered" materials is accomplished by selectively depositing desired atoms and groups of atoms into designed locations to permit the construction of a true three-dimensionally engineered material. Where order is an engineering need, it can be designed in a local scale or interspersed in varying amounts including layers through the material to create new material functions.

The materials encompass materials which can include non-epitaxial crystalline layers A and B, homogeneous in the x and y directions, but which are randomly or nonperiodically but specifically spaced in the z direction. Further, the materials include any combination of layers in a non-epitaxial, non-superlattice structure, such as polycrystalline or amorphous layers interleaved with crystalline or noncrystalline layers. Further, included are non-epitaxially grown material structures containing columns or groups of atoms which can be arranged periodically and isotropically. Many deposition techniques can be utilized singularly or in combination with a variety of activation techniques to construct the materials, which include sputtering, electrochemical, laser, ion beam, thermal evaporation, chemical vapor deposition or glow discharge (plasma) techniques. Other excitation processes also can be combined with the above techniques.

28 Claims, 2 Drawing Figures

U.S. PATENT DOCUMENTS

| | | | |
|---|---|---|---|
| 3,573,098 | 3/1971 | Bieber et al. | 427/37 |
| 3,682,729 | 8/1972 | Berger et al. | 427/91 |
| 3,734,769 | 5/1973 | Hirschfeld | 427/26 |
| 3,751,310 | 8/1973 | Cho | 148/175 |
| 3,829,356 | 8/1974 | Rutt | 428/189 |
| 3,916,034 | 10/1975 | Tsuchimoto | 427/38 |
| 4,058,430 | 11/1977 | Suntola et al. | 427/255.7 |
| 4,220,682 | 9/1980 | Macedo et al. | 428/212 |
| 4,261,771 | 4/1981 | Dingle et al. | 148/175 |
| 4,343,883 | 8/1982 | Kassel et al. | 427/255.7 |
| 4,347,112 | 8/1982 | Togami | 427/255.7 |
| 4,389,973 | 6/1983 | Suntola et al. | 427/255.7 |
| 4,413,022 | 11/1983 | Suntola et al. | 427/255.7 |
| 4,468,437 | 8/1984 | Patten et al. | 427/255.7 |
| 4,565,731 | 1/1986 | Komatsu et al. | 428/212 |

OTHER PUBLICATIONS

D. Nagel, et al., Graded-Layer-Thickness Bragg X-Ray Reflectors, section entitled Production of Multilayers.

J. A. Giordmaine, Solid-State Electronics: Scientific Basis for Future Advances, 3-18-77, p. 1237, columns 1-3.

A. M. Saxena et al., Multilayer Neutron Monochromators, 4-2-77, section entitled Multilayer Preparation; pp. 805 & 806.

E. Spiller et al., Controlled Fabrication of Multilayer Soft-X-Ray Mirrors, 12-1-80, p. 1049, col. 2, lines 14 to 19.

T. Barbee & D. Keith, Synthesis & Properties of Metastable Phases, Oct. 5-9, 1980, p. 106, first two full paragraphs.

COMPOSITIONALLY VARIED MATERIALS AND METHOD FOR SYNTHESIZING THE MATERIALS

This is a divisional of patent application Ser. No. 422,155 filed Sept. 23, 1982 now U.S. Pat. No. 4,520,039.

BACKGROUND OF THE INVENTION

This invention relates to a method of synthesizing a new class of materials by varying the composition throughout the bulk to attain characteristics tailormade for desired applications. The compositions and configurations of the first few coordination spheres of the constituents of a material are controlled to distribute a variety of local environments throughout the material. These synthetic materials are free from the constraints of crystalline symmetries and therefore can yield new types of nonequilibrium disordered structures of varying complexity. The invention enables the production of improved materials which have a wide range of applications in substantially all fields of utilization, for example, in photoresponsive applications, such as solar cells; in superconductivity; in cataylsis; in thermoelectricity; in magnetism; as well as in the development of entirely new materials having properties which can make possible entirely new applications.

Numerous attempts to construct both natural and new crystalline analogue materials have been made with the aim of extending the range of material properties heretofore limited by the availability of natural crystalline materials. One such attempt is compositional modulation by molecular beam epitaxy (MBE) deposition on single crystal substrates. For example, in Dingle et al., U.S. Pat. No. 4,261,771, the fabrication of monolayer semiconductors by one MBE technique is described. These modulated prior art structures are typically called "superlattices." Superlattices are developed on the concept of layers of materials forming a one-dimensional periodic potential by a periodic variation of alloy composition or of impurity density. Typically, the largest period in these superlattices is on the order of a few hundred Angstroms; however, monatomic layered structures have also been constructed. The superlattices can be characterized by the format of several layers of A (such as GaAs) followed by several layers of B (such as AlAs), in a repetitive manner; formed on a single crystal substrate. The desired superlattice is a single crystal synthetic material with good crystalline quality and long range order. The conventional superlattice concepts have been utilized for special electronic and optical effects.

In addition to superlattices, Dingle discloses quasi-superlattices and non-superlattice structures. The former are comprised of epitaxially grown islands of a foreign material in an otherwise homogeneous layered background material. Non-superlattice structures are an extension of quasi-superlattice materials in that the islands are grown into columns extending vertically through the homogeneous layered background material. These superlattice type structures suffer from the same problems that plague homogeneous crystalline materials. There is very little variation possible in the range of constituents and in the type of superlattices constructed, because of the requirements that the spacing between the layers be approximately the same as that of the equilibrium crystalline constituents. These superlattices are restricted to a very small number of relatively low melting point crystalline materials and the growth rates are constrained by the MBE technique.

In addition to the MBE type of superlattice construction techniques, other researchers have developed layered synthetic microstructures utilizing different forms of vapor deposition, including diode and magnetron sputtering and standard multisource evaporation. The layer dimensions are controlled by shutters or by moving the substrates relative to the material sources or controlling reactive gas partial pressure or with combinations of shutters and relative motion. The materials reported have been formed from crystalline layers, noncrystalline layers and mixtures thereof; however, each of the efforts so far reported is directed at the synthesis of superlattice-type structures by precisely reproducing the deposition conditions on a periodically reoccurring basis. These materials can be thought of as synthetic crystals or crystal analogues in which it is crucial that the long range periodicity, repetition of a particular combination of layers or grading of layer spacing be maintained. These structures are both structurally and chemically homogeneous in the x-y plane, but are periodic in the third (z) direction. These construction approaches can utilize a greater variety of materials; but as previously reported, they have not produced as great a variety of structures as have been demonstrated by MBE techniques.

The previous works of the undersigned, as described for example in U.S. Pat. Nos. 4,177,473; 4,177,474 and 4,342,044, describe forming various types of matrices and dispersing nonequilibrium configurations therein. The principles of layering and compositional modulation in the prior work is dependent upon the amounts of material distributed on an atomic and molecular scale throughout the material. For example, as described in the prior work, very small amounts of material were added to a matrix to increase the bulk resistance properties of the resulting material. The addition of larger amounts of material to the matrix decreases the bulk resistance properties. The principles are utilized to modify a range of materials from metallic to dielectric materials. These techniques provide a distribution of material configurations on an atomic and molecular scale from microscopic to macroscopic configurations in the matrix material. The distribution of compositional changes of a primarily nonequilibrium nature lead from individual atoms or groups of atoms to layering when sufficient amounts of material are introduced into the matrix. These techniques provide significant control of material properties such as thermal and electrical conductivity and other parameters by introducing atoms and alloys into materials which bond in a manner not previously described.

This invention allows for the first time even more fundamental control of material properties by freeing materials not only from crystalline symmetry, but also from the periodic local order required in previous amorphous and disordered materials. By the principles and methods disclosed herein, spatial and orientational placement of similar or dissimilar atoms or groups of atoms is possible with such increased precision and control of the local configurations to result in qualitatively new phenomena. The atoms need not be restricted to "d band" and "f band" atoms, but can be any atom in which the controlled aspects of the interaction with the local environment plays a significant role physically, electrically or chemically so as to affect the physical properties and hence the functions of the materials. This results in means of synthesizing new materials which are disordered is several different senses simultaneously. Such structures can be referred to as "multi-disordered".

SUMMARY OF THE INVENTION

The invention provides the means for designing materials containing sequentially or nonsequentially three-dimensionally distributed local environments including nonequilibrium disordered environments. These environments can possess local order even in one or two as well as three dimensions. This order can be of a periodic nature and its proximity and type can be controlled to obtain specific properties which can be coupled or decoupled from one another as well as from the constraints implied by either crystalline ordered or disordered structures. In contrast to the prior art, the invention discards the full structures of a superlattice, epitaxy of layers, islands or columns, periodicity of compositional and structural variations, stoichiometry and homogeneity of the constructed materials. The compositional variation which produces the required nonequilibrium disordered materials is accomplished by independently controlling and selectively depositing desired atoms or groups of atoms into specific locations to permit the construction of a completely three-dimensionally engineered material.

The invention also provides for precisely varying the spatial and energetic orbital relationships of atoms and groups of atoms, such that local environments can be produced which are directionally oriented without regard to the surrounding matrix material. The resulting density of electronic states then can vary with position as well as with energy. The purpose of this approach can be understood, for example, in terms of active sites. For example, in hydrogen storage work, varied active sites for dissassociation and storage can be placed by design in the bulk as well as on the surface of the material. Atoms or groups of atoms, with various orbital configurations that allow for weak bonding, or complexing, such as those with d-band configurations, or even more localized f-band configurations, can be dispersed to allow for spaces between sites to provide designed diffusion lengths and sites of a unique nature due to the atoms utilized and the local environments designed for them.

While layers of similar or dissimilar interspersed atoms can be one embodiment, another would be the nonsequential placement of layers of different compositions modulated in amorphous or disordered form. The most sophisticated and possibly the ultimate version of the invention is the placement of single atoms or groups of atoms some in excited states, not in layered form, but in specific sites in the three-dimensional solid, which could not be accomplished using conventional plasma or vacuum deposition techniques. In this manner, an atom or group of atoms can be placed in three-dimensional space in ways that have not been possible previously. For example, electrical and thermal conductivity and optical band gaps can be dramatically altered. There can be unusual doping effects and the materials can be designed to control catalytic activity rather than leave it to the result of random effects. Desired thermoelectric effects can be designed in these materials since the phonon scattering can be drastically affected. Various materials including optical materials can be specifically designed to include nonequilibrium configurations and can be made by codeposition and by means of individual excitation so that unique nearest neighbor configurations can be made. Therefore, even in an amorphous material disorder disappears as a single parameter; since there is a designed atomic order which does not depend on periodicity or an any kind of spatial or energetic arrangement except as necessary for the design of the material properties for the material functions desired.

Many deposition techniques can be utilized singularly or in combination to construct the materials of the invention. These include sputtering, electrochemical, thermal or laser evaporation, chemical vapor deposition or any type of plasma techniques, especially those which promote the generation of free radicals. Atoms or groups of atoms also can be placed in designed locations in a material constructed by ion beam or beams of neutral atomic or molecular species. These techniques allow a material to be constructed which can be changed throughout (i.e., each layer can be different) or which can not only be sequential in nature or any combination thereof to produce materials with properties unlike those resulting from construction utilizing the prior art synthesis techniques. The deposition process can not only be automated by these techniques, but independent excitation of selected species prior or during deposition can produce unusual atomic and molecular configurations. For example, laser tuning can be utilized to produce the selective excitation of the species during the deposition process to result in materials that have unusual chemical and orbital relationships and can exist in a layered or compositionally modulated form.

DESCRIPTION OF THE PREFERRED EMBODIMENTS

Figure 1:
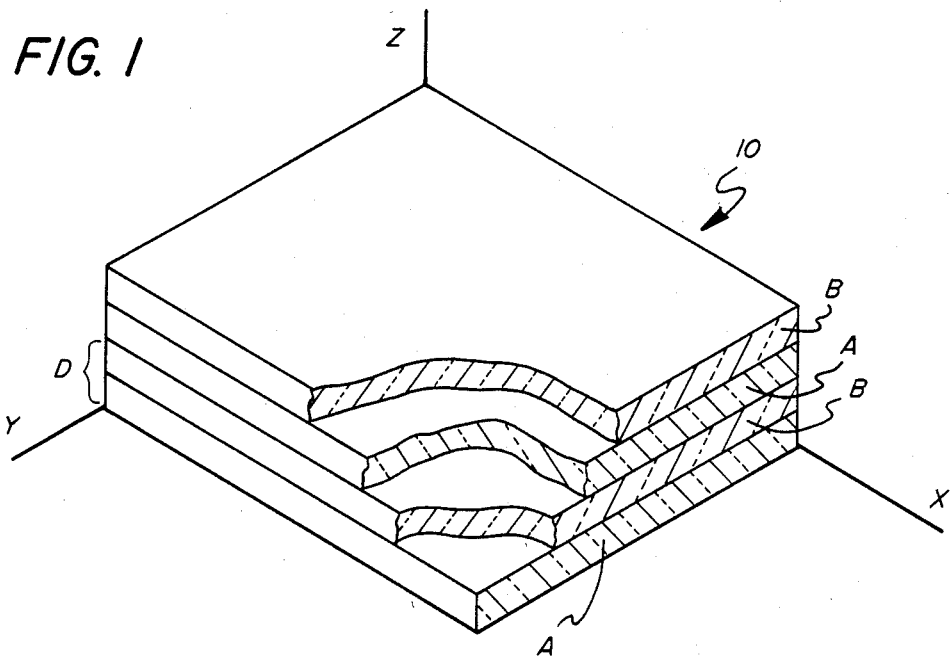
FIG. 1 is an essentially three dimensional schematic representation of the concept of a compositionally varied material.

Referring to FIG. 1, there is shown a schematic representation of a portion of a compositionally modulated material 10. In terms of the schematic, the prior art can be thought of as a crystalline analogue material 10 having layers, typically A and B, homogeneous in the x and y directions (or any plane) with the spacing "d" of the layers being periodic in the z direction (normal to the plane). The thickness of each layer A and each layer B is uniformly repeated, but may not be equal in thickness to one another. A modification of this scheme, restricted to epitaxially grown materials, U.S. Pat. No. 4,261,771, introduces islands and columns of foreign material grown from a single crystal substrate and embedded in a homogeneous layered matrix also epitaxially grown from the same substrate.

In contrast, the materials of the present invention encompass materials which can include non-epitaxial crystalline layers A and B, homogeneous in the x and y directions, but which are selectively or randomly spaced in the z direction. Further, the materials of the present invention include any combination of layers in a non-epitaxial, non-superlattice structure, such as polycrystalline or amorphous layers interleaved with crystalline or noncrystalline layers. Further, the invention includes non-epitaxially grown material structures containing columns or groups which can be arranged periodically. Additionally, any of the non-epitaxially grown prior art material structures can be incorporated as primary construction elements in combination with the materials of the present invention.

The invention allows the formation of entirely new nonequilibrium materials, which are composed of regular or nonregular patterns of new types of disordered structures of varying complexity. Homogeneous amorphous materials have been utilized to overcome some of the inherent constraints imposed by crystalline structures of the prior art. The prior art is designed to achieve homogeneous materials, whereas the instant invention is directed at controlled inhomogeneous materials, through differing local environment configurations, placement and chemical composition. However, the materials of this invention surpass the advantages presented by homogeneous amorphous materials by the control of local atomic species and environments and their nearest neighbor interaction using the placement and coordination of the primary structural elements as well as placing deviant orbital relationships in new and unique positions. Their arrangement is such that their proximity to one another does not encourage unwanted fluctuations that are sometimes present in homogeneous amorphous material, or the coupling and modification of properties by force of the periodic potentials inherent in the superlattice structures of the prior art. For example, doping on a more substitutional level can be achieved. The materials do involve the design of coupling or decoupling of properties where desired, such as the electron, magnetic and phonon interactions. This allows separate and different relationships to be designed into the material without the disadvantages and restrictions of the prior art.

The structures of the materials of the invention utilize layers and individual atoms or groups of atoms which need not follow a sequential pattern from layer to layer. These layers can be deliberately designed so that they are not geometrically regular in spatial separation and subsequent layers can be entirely different from the preceeding layers, for example an elemental layer or an alloy layer, which can be amorphous or crystalline. MBE is one specialized technique of the prior art which provides a method for producing precisely layered crystalline materials for some optical and electronic applications. The present invention which includes plasma techniques, removes the crystalline lattice symmetry constraints as well as problems which can be caused by mismatches in amorphous materials. Even in amorphous materials, layering can produce a heterojunction effect if they are of thicknesses thicker than or comparable to the depletion or screening width.

One of the basic problems in any kind of solid state device is to avoid not only interfacial effects but heterojunction effects as one changes materials, adds materials or layers materials. The invention provides a technique for the first time of controlling the interfacial, strain and stress effects inherent in amorphous materials, which can be eliminated or minimized. Unlike previous techniques, each layer can be designed to produce chemical effects with the next layer, which is in contrast to the deposition of a typical prior homogeneous amorphous film where the initial layer can vary from the following layers by accident. In other words, there can be a designed chemical interaction between different layers and groups of atoms in the compositional modulated form of the invention. The procedure allows layered structures to be made where the layers are of a thickness such that the material can appear to be electronically homogeneous and in that way avoids heterojunction effects. By making these kinds of layered structures a new material is achieved which has, for example, the desirable electrical properties of one of the constituents while retaining the optical properties of the two constituents.

Differing atoms with different anisotropic effects can be placed in not only regular distribution, but in planned "irregular" distribution throughout the material. This provides complete freedom of energy positions, spatial positions, spin compensations, chemical relativities, magnetic and electronic effects. In superconductivity, the need is to be able to add selected elements to form new materials to enable the control of specific properties such as the formation of Cooper pairs, the mass and polarizability of the elements, the Debye temperature, the density of states at the Fermi energy, and the strength of the electron-phonon interactions. All of these properties can be affected by placement of atoms in specific positions on overall structures such as chains or groups. The placement of groups or atoms, for example, in disordered materials can improve $\omega_o$ and umklapp scattering which previously could not be done. AIP Conference Proceedings, No. 4, Cohen, p. 26, 1972. For example, to affect the electical conductivity of the composite material, the groups can be either designed so that they can be within tunnelling distances, or, by varying the intergroup distance one can design avalanche effects. The atoms and groups of atoms then become specific random or nonrandom impurities.

Amorphous materials are presently utilized in a manner to take advantage of the great variety of interactions between constituent atoms or molecules in contrast to the restricted number and kinds of interactions imposed by a crystalline lattice. In the present invention, the advantages or crystalline and amorphous properties can be combined for those devices and applications in which periodicity is essential to the physics. Periodicity can be placed in an amorphous matrix through the utilization of these compositional modulation and layering concepts. The material can include spatially repeating compositional units, atoms, groups of atoms or layers without the overall bulk inhibition of crystalline periodicity.

Also, individual atoms or groups of atoms in various configurations can be provided, which can be combined with other atoms or groups of atoms and be disbursed throughout the material. As stated, the individual atoms or groups of atoms, in these materials need not be in a regular pattern, but can have a varying spatial pattern, such as being graded or nonsequential throughout the material. By the proper choice of atoms or groups of atoms, their orbitals and isolated configurations, anisotropic effects not permitted in any prior type of material can be produced.

These procedures provide varying geometrical environments for the same atom or a variety of atoms, so that these atoms can bond with other surrounding atoms in different coordination configurations as well as unusual nonbonding relationships resulting in entirely new chemical environments. The procedures provide means for arranging different chemical environments which can be distributed and located throughout the material in the spatial pattern desired. For example, one part or portion of a material can have entirely different local environments from other portions. The varying electronic states resulting from the various spatial patterns which are formed and the various chemical environments which can be designed, can be reflected in many parameters as a type of density of states or change of states in the energy gap of a semiconductor except that this density of states can be spatially arranged.

In essence, the material of the invention is a compositionally modulated material utilizing the very concept of irregularity, inhomogeniety, "disorder" or localized order which have been avoided in the prior art, to achieve benefits which have not been exhibited in prior materials. The local environments need not be repeated throughout the material in a periodic manner as in the layered or compositionally modulated materials of the prior art. Further, because of the above-described effects the specific types of disorder and their arrangement in a spatial pattern, the materials as described by this invention cannot be thought of as truly amorphous materials as typically produced by the prior art since the material is more than a random placement of atoms. The placement of atoms and orbitals of a specific type that can either interact with their local environment or with one another depending upon their spacing throughout an amorphous material and an amorphous matrix can be achieved. The composite material appears to be homogeneous, but the positions of the orbitals of the atoms can have relationships designed to emphasize a particular parameter, such as spin compensation or decompensation. The materials thus formed give a new meaning to disorder based on not only nearest neighbor relationships, but "disorder" among functional groups, which can be layers or groups, on a distance scale which can be as small as a single atomic diameter. Hence, a totally new class of "synthetic nonequilibrium multi-disordered" materials have been made available.

For example, these local chemical environments can provide a spatial pattern of different catalytically active sites throughout the material. In designing catalytically active materials, the local chemical environments are spatially controlled to provide desired catalytically active sites while other sites can be designed into the material to deactivate, poisonous species which inhibit catalytic activity. Various sites can be separated by design so that, for example, the splitting of a molecule can take place at one point in the material and the storage of its constituents atoms at another, while nearby sites can inactivate the undesirable reaction products. The invention provides designed diffusion lengths, controlled pore type activity and specially shaped configurations. These structures and properties are normally created (if at all) by accident on the surfaces of the prior materials. In contrast, the structures and properties are designed in desired locations in the present materials as a bulk phenomena and in orders of magnitude greater in numbers than those of the prior materials.

Figure 2:
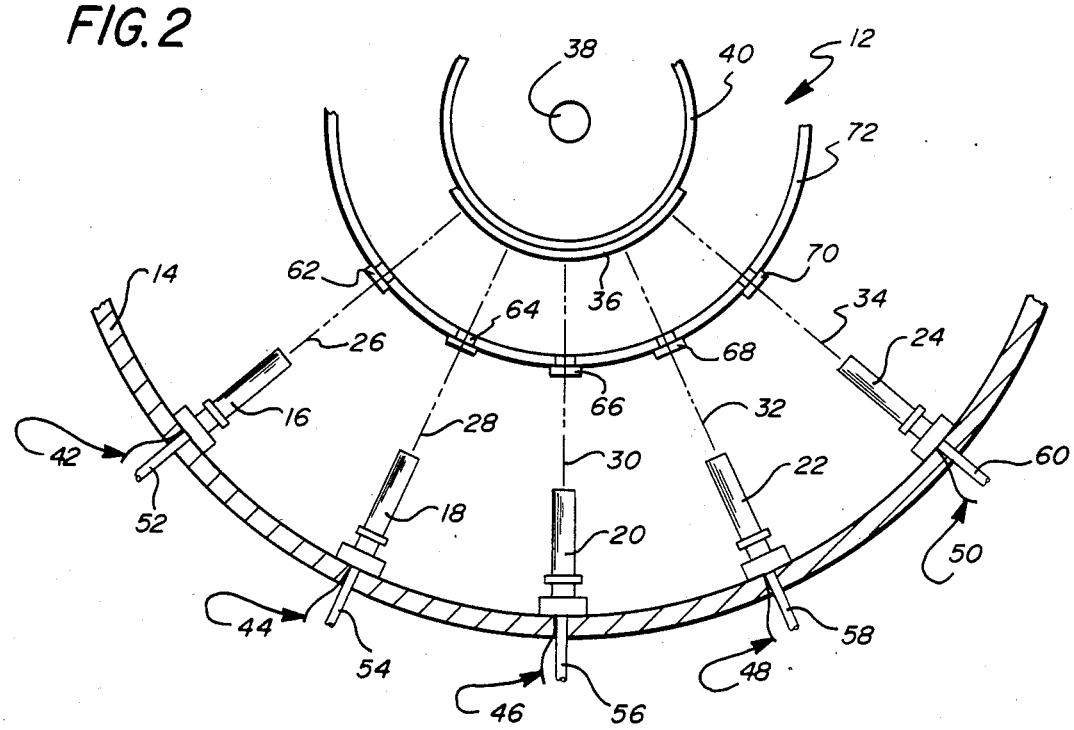
FIG. 2 is a partial diagrammatic representation of one embodiment of deposition system for depositing the compositionally varied materials of the invention.

The materials of the present invention can be formed in a variety of methods, such as by sputtering, plasma deposition or combinations thereof as set forth above. One illustrative deposition system 12 is partially shown in FIG. 2. The deposition system 12 includes a housing 14 which is evacuated in a conventional manner to the pressure desired. The system 12 includes a plurality of ion beam sources 16, 18, 20, 22 and 24 mounted on the housing 14. Each of the sources can direct respective beams 26, 28, 30, 32 and 34 of atoms or groups of atoms from one or more selected elements on a substrate 36. The temperature of the substrate 36 can be controlled by a heater 38, such as an infrared lamp or array of lamps, which can be mounted inside a substrate holder 40.

Each of the ion beam sources 16, 18, 20, 22 and 24 can include a deflector plate to direct the atoms or groups of atoms onto the substrate 36 in a desired pattern. Each of the sources also includes a neutralizer grid to remove excess charge from the ions.

Each of the ion sources 16, 18, 20, 22 and 24 also includes respective power leads 42, 44, 46, 48 and 50 and gas inlets 52, 54, 56, 58, and 60. The sources can be turned on or off and the beams can be directed as desired onto the substrate 36 by controlling the internal deflector plates and/or moving the substrate 36. Also, the beams 26, 28, 30, 32 and 34 can be directed through respective shutters 62, 64, 66, 68 and 70 mounted on a shutter barrier 72. The shutters can be of an electronic type for ease and speed of operation.

The number of ion beam sources illustrated is not critical and can be selected as desired. The type and configuration of the substrate and its orientation with the ion beams also can be selected as desired. Further, the one or more ion beams can be combined with a plasma, sputtering or other type of deposition parameters to insert atoms into the material as it is being deposited in a timed sequence. The materials of the invention produced by the system can thus be engineered in a truly three-dimensional design to select the properties desired without regard to long-range periodicity or other crystalline lattice constraints. Free radicals also can be deposited and the atoms and radicals can be independently excited as they are deposited and "frozen into" and interact with the matrix.

A comparison of properties of some representative materials produced by the techniques of the present invention to homogeneous and superlattice type materials are illustrated in Tables I-V. Each of the materials was deposited utilizing substantially the same deposition conditions.

TABLE I

Homogeneous Materials

| Composition | Resistivity at 25 K in $\mu\Omega$-cm ($\rho$) | Superconducting Transition Temperature in K ($T_c$) | Extrapolated Critical field in kG ($H_{c2}$) | Critical field gradient in kG/K $\left(\dfrac{dH_{c2}}{dT}\right)$ |
|---|---|---|---|---|
| $Mo_{60.4}Si_{39.6}$ | 453.9 | 4.85 | 123.18 | −25.2 |
| $Mo_{68.5}Si_{32.5}$ | 360.8 | 6.19 | 147.42 | −23.9 |
| $Mo_{41.8}C_{58.2}$ | 367.6 | 9.65 | 264.58 | −27.6 |
| $Mo_{54}C_{46}$ | 242.1 | 9.20 | 236.46 | −25.8 |
| $Mo_{57.3}C_{26.9}Si_{15.8}$ | 195.2 | 4.94 | 115.41 | −23.5 |
| $Mo_{56.9}C_{19.0}Si_{24.1}$ | 197.1 | 4.26 | 99.18 | −23.2 |
| $Mo_{40.7}C_{33.9}Si_{12.5}Al_{12.9}$ | 280.1 | 3.30 | 87.12 | −26.7 |

Table I illustrates properties of some representative homogeneous materials which provide a basis for comparison to the properties of some representative materials of the present invention illustrated in Table III-V. Table I includes seven different homogeneous material samples. The first two materials are two different compositions of molybdenum and silicon, the third and fourth materials are two different compositions of molybdenum and carbon, the fifth and sixth materials are two different compositions of molybdenum, carbon and silicon and the seventh material is a composition of molybdenum, carbon, silicon and aluminum. Each of these materials is an essentially homogeneous compositional mixture throughout the bulk of the material.

TABLE II

Superlattice Materials

| Composition | Resistivity at 25 K in $\mu\Omega$-cm ($\rho$) | Superconducting Transition Temperature in K ($T_c$) | Extrapolated Upper Critical field in kG ($H_{c2}$) | Critical field gradient in kG/K $\left(\dfrac{dH_{c2}}{dT}\right)$ |
|---|---|---|---|---|
| $Mo_{65}Si_{35}$ | 173.4 | 5.97 | 120.5 | −20.3 |
| $Mo_{65.5}Si_{34.5}$ | 168.8 | 5.47 | 106.4 | −19.9 |
| $Mo_{63}Si_{37}$ | 47.2 | 1.66 | 23.3 | −14.0 |

Table II illustrates properties of some representative superlattice type materials.

The layer spacing (d) of the three materials is respectively 13, 53 and 88 Angstroms. The properties change substantially uniformly with a change in layer spacing d.

Table II includes three so-called superlattice or layered materials of substantially the same molybdenum and silicon composition, each having a different d spacing. The first material has a bulk composition of about 65 atomic percent molybdenum and 35 atomic percent silicon. Referring to FIG. 1, the layer A would be molybdenum and the layer B would be silicon and the d spacing would be 13 angstroms. This equates on an atomic percent basis, with each molybdenum layer A being about 8.45 angstroms thick and each silicon layer B being about 4.55 angstroms thick. These layer pairs are repeated to form the bulk of the material.

TABLE III

Multiple Layer Materials

| Composition | Resistivity at 25 K in $\mu\Omega$-cm ($\rho$) | Superconducting Transition Temperature in K ($T_c$) | Extrapolated Upper Critical field in kG ($H_{c2}$) | Critical field gradient in kG/K $\left(\dfrac{dH_{c2}}{dT}\right)$ |
|---|---|---|---|---|
| $Mo_{55.1}C_{22.8}Si_{22.1}$ | 198.95 | 5.21 | 94.9 | −18.59 |
| $Mo_{58.6}C_{23.8}Si_{17.6}$ | 229.38 | 6.13 | 78.4 | −12.88 |

Table III illustrates some representative examples of the present invention in the format of ABC ABC, etc, with different layer spacings. The layer spacings of the two examples are respectively 64 and 20 Angstroms. The two three component layered materials are formed of layers of molybdenum, carbon and silicon with different d spacing and different atomic percentages. The first material has a bulk composition of about 55.1 atomic percent molybdenum, 22.8 atomic percent carbon and 22.1 atomic percent silicon. Each layer A would be molybdenum about 35.3 angstroms thick, each layer B would be carbon about 14.6 angstroms thick and each layer C would be silicon about 14.1 angstroms thick. These three layers sets 64 angstroms thick are repeated to form the bulk of the material.

The power of decoupling the material properties by use of the techniques of the present invention is illustrated by comparing the properties of the three component layered structures with those of the homogeneous and superlattice materials in Tables I and II. The homogeneous materials exhibit substantially no change in their properties without a change in composition. The superlattice materials of Table II are of interest in that they exhibit a continuous variation in properties with varying layer thicknesses of materials having substantially the same composition. It should be noted that all the properties are coupled in that each property changes in direct proportion to the layer spacing, i.e. all the properties are continuously increasing or decreasing with the variation in layer thickness.

In marked contrast, the material properties in Table III are decoupled as shown by the increase in $\rho$ $T_c$ with decrease in layer thickness, while both $H_{c2}$ and $dH_{c2}/dT$ decrease in value. Furthermore, these properties are significantly different than those exhibited by substantially the same homogeneous composition.

TABLE IV

Materials Including Groups of Atoms

| Composition | Resistivity at 25 K in $\mu\Omega$-cm ($\rho$) | Superconducting Transition Temperature in K ($T_c$) | Extrapolated Upper Critical field in kG ($H_{c2}$) | Critical field gradient in kG/K $\left(\dfrac{dH_{c2}}{dT}\right)$ |
|---|---|---|---|---|
| $Mo_{52.6}C_{47.2}Si_{0.2}$ | 157.96 | 11.15 | 178.8 | −16.11 |
| $Mo_{46.7}C_{53.1}Si_{0.2}$ | 172.42 | 4.73 | 50.26 | −11.03 |

Table IV illustrates the property changes due to introduction of groups of atoms in the composite material. The first material, while containing substantially the identical atomic composition of silicon as the second material, includes the silicon in groups substantially at the interface between succeeding sets of Mo-C layers. The layer spacing of the above two examples is respectively 11 and 80 Angstroms. These two three component materials include layers of molybdenum and carbon and groups of silicon with different d spacings. The first material has a bulk composition of about 52.6 atomic percent molybdenum, 47.2 atomic percent carbon and 0.2 atomic percent silicon. Each layer A would be molybdenum about 5.8 angstroms thick, each layer B would be carbon about 5.2 angstroms thick and the groups of silicon would (if thin enough to form a layer) be about 0.2 angstroms thick. The silicon is insufficient to form even a monolayer and hence will be atoms or groups of atoms of silicon between the layers of molybdenum and carbon at the interface of each set. The three material sets 11 angstroms thick are repeated to form the bulk of the material. Although layers of molybdenum and carbon have been utilized in the example with groups of silicon, as previously described a single element or material can be utilized to form a matrix with the groups of silicon placed at desired locations in the matrix to form the material. Further, although the Mo-C compositions are somewhat different, as shown by the homogeneous materials in Table I, numbers 3 and 4, the properties do not vary significantly in this Mo-C compositional range. The first material with groups of atoms has properties which are both decoupled and dramatically different from those of the second layered material.

TABLE V

Varied Layer Materials

| Composition | Resistivity at 25 K in μΩ-cm (ρ) | Superconducting Transition Temperature in K ($T_c$) | Extrapolated Upper Critical field in kG ($H_{c2}$) | Critical field gradient in kG/K $\left(\dfrac{dH_{c2}}{dT}\right)$ |
|---|---|---|---|---|
| $Mo_{40}C_{24}Si_{18}Al_{18}$ | 27.5 | 3.30 | Undefined* | −2.35 |

*Exponential increase with decreasing temperature

Table V shows the properties of an illustrative material with varying layer spacing, which shows a further dramatic decoupling of the properties from the previous materials. The properties of this material can be compared to those of the last example in Table I.

This material consists of five sets of ten layers of the four materials. The composition shown is the overall composition as identified by Auger analysis. The layer spacing of each of the 10 layers in each set is respectively 11, 17, 7, 43, 21, 9, 12, 8, 11 and 38 Angstroms. This material has a bulk composition of about 40 atomic percent molybdenum, 24 atomic percent carbon, and 18 atomic percent each of silicon and aluminum. The first 11 angstroms thick layer in each of the sets includes layer A of molybdenum about 4.4 angstroms thick, layer B of carbon about 2.6 angstroms thick, layer C of silicon about 2 angstroms thick and layer D of aluminum about 2 angstroms thick. The subsequent nine layers in each set are each formed of the four materials with thicknesses corresponding to their percentage and the layer thickness. This material has both local disorder, random spacing and grouping of atoms in each set with the sets repeated in a periodic fashion.

As disclosed above, a material can be put down in accordance with the invention by utilizing alternating layers of materials A and B; however, an atom or group of atoms, can be inserted as desired within the various layers A and B to decouple and control the desired parameters in the material. These groups can be formed from one type of atom or various types of atoms and can be compositionally different throughout the bulk. These atoms or groups of atoms can be inserted in a time sequence manner and can include laser activation to change local sites throughout the material as it is deposited. Further, the groups can be inserted in a material which is formed only of a material A without layering. Also, the layer structure of the materials can be much more complicated than that described above and can be for example A, B, C, B, D, A, C, E, etc.

The techniques of the invention can be utilized as a new way of doping photovoltaic materials or changing the band gap as desired within the photovoltaic material, controlling the phonon and electron relationships in a thermoelectric material to provide the desired thermal and electrical conductivity properties, in catalysis to provide the sites desired and in superconductivity to provide the desired critical temperature, critical current and critical field properties. The optical properties can be changed without changing the electronic properties. Other unique anisotropic effects can be produced by the unique activated bonding by various atoms, free radicals or clusters thereof. Atoms or groups of atoms can be placed into the matrix throughout a composite material which depends upon periodicity. The material can be produced by many means where timing of the release of the atoms or groups of atoms is a controllable parameter.

Numerous modifications and variations of the present invention are possible in light of the above techniques. The substrate holder 40 can be rastered with respect to the ion beams 26, 28, 30, 32 and 34 to deposit the atoms in the desired location on the substrate 36. The choice of atoms and groups of atoms is not limited by the examples and can be any combination of atoms desired. Further, the gases input to the ion sources can be atomic gases or molecular compounds and background gases can be utilized in the system if desired. It is therefore to be understood that within the scope of the appended claims the invention can be practiced otherwise than as specifically described.

What is claimed and desired to be secured by Letters Patent of the United States is:

1. A designed compositionally varied material comprising:
   a matrix formed from a first atom or atoms or groups of atoms, said first atom or atoms or groups of atoms possessing a first set of physical properties;
   a second atom or atoms or groups of atoms possessing a second set of physical properties, at least one property of said second set differing from a corresponding property of said first atom or atoms or groups of atoms;
   a spatial pattern, of substantially atomic size in at least one dimension thereof, formed in the matrix by said second atom or atoms or group of atoms so as to provide at least one non-equilibrium disordered local environment; and
   said relationship between the matrix and the first and second atoms or groups of atoms engineered to couple or decouple at least one physical property of the first atom or atoms or groups of atoms from a corresponding property of the second atom or atoms or groups of atoms, whereby the compositionally varied material is engineered so as to possess a range of preselected physical properties.

2. A material as in claim 1 wherein said pattern periodically repeats.

3. A material as in claim 2 wherein said second atom or atoms or group of atoms is placed in said matrix in periodic locations so as to define the pattern.

4. A material as in claim 1 wherein said pattern is nonperiodic.

5. A material as in claim 4 wherein said second atom or atoms or group of atoms is placed in said matris in non-periodic locations.

6. A material as in claim 1 wherein the matrix locations of said second atom or atoms or group of atoms are designed so that substantially all of the electrons thereof are within tunneling distance of the first atom or atoms or groups of atoms.

7. A material as in claim 1 wherein said second atom or atoms or group of atoms is bonded in different configurations so as to form non-periodic spatial patterns throughout at least a portion of said matrix.

8. A material as in claim 1 wherein said second atom or atoms or group of atoms include excited species frozen into at least some locations in the matrix.

9. A material as in claim 1 wherein said second atom or atoms or groups of atoms include directionally oriented local environments in at least some matrix locations different than the directionally oriented local environments in other locations.

10. A material as in claim 1 wherein said second atom or atoms or groups of atoms include free radicals frozen into at least some matrix locations.

11. A material as in claim 1 further including at least a third atom or atoms or groups of atoms possessing a third set of physical properties, at least one property of said third set differing from a corresponding property of said first and second sets of properties.

12. A material as in claim 11 wherein the third atom or atoms or group of atoms form a second spatial pattern in the matrix so as to form at least one non-equilibrium local environment.

13. A material as in claim 12 wherein the relationship between the matrix and the first, second and third atom, atoms or groups of atoms are engineered to couple or decouple at least one property thereof from a corresponding property of the other atoms.

14. A material as in claim 11 wherein said third atom or atoms or groups of atoms are interleaved in layers with said first atom or atoms or groups of atoms; and said second atom or atoms or groups of atoms are designed into at least some of the layers of said first atom or atoms or groups of atoms.

15. A material as in claim 14 wherein said different interleaved layers are non-periodically spaced.

16. A material as in claim 14 wherein said different interleaved layers are periodically spaced.

17. A material as in claim 14 wherein at least some of said layers are non-epitaxial crystalline layers.

18. A material as in claim 14 wherein at least a first set of said layers are polycrystalline interleaved with at least a second set of crystalline layers.

19. A material as in claim 14 wherein at least a first set of said layers are polycrystalline interleaved with at least a second set of polycrystalline layers.

20. The material of claim 14 wherein at least a first set of said layers are polycrystalline interleaved with at least a second set of amorphous layers.

21. A material as in claim 14 wherein at least a first set of said layers are crystalline interleaved with at least a second set of amorphous layers.

22. A material as in claim 1 wherein at least a first set of said layers are amorphous interleaved with at least a second set of amorphous layers.

23. A material as in claim 14 wherein said layers are interleaved in a graded order from amorphous to crystalline throughout the matrix.

24. A material as in claim 1 wherein said spatial pattern is formed so as to couple or decouple an electronic property from one other physical property.

25. A material as in claim 1 wherein said matrix is homogeneous in two dimensions and nonhomogeneous in the third dimension.

26. A material as in claim 1 wherein said material is homogeneous in one dimension and nonhomogeneous in two dimensions.

27. A material as in claim 1 wherein said material is non-homogeneous in all three dimensions.

28. A material as in claim 1 wherein electrical, optical, mechanical, magnetic or thermal properties may be coupled or decoupled.

* * * * *